(12) United States Patent
Moraveji

(10) Patent No.: US 6,590,980 B1
(45) Date of Patent: Jul. 8, 2003

(54) LOW VOLTAGE, LOW POWER OPERATIONAL AMPLIFIER WITH RAIL TO RAIL OUTPUT

(75) Inventor: Farhood Moraveji, Saratoga, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 09/962,404

(22) Filed: Sep. 24, 2001

(51) Int. Cl.[7] .................................................. H03F 3/45
(52) U.S. Cl. ........................ 380/255; 330/258; 330/259; 327/561
(58) Field of Search ............................. 330/255, 258, 330/259, 252, 253, 260–265, 257, 267, 269, 271, 273, 288, 291; 327/561, 562, 563, 560

(56) References Cited

U.S. PATENT DOCUMENTS

| | | | | |
|---|---|---|---|---|
| 4,533,876 A | * | 8/1985 | Haque et al. | 330/253 |
| 5,006,817 A | * | 4/1991 | Babanezhad | 330/253 |
| 5,187,448 A | * | 2/1993 | Brooks et al. | 330/258 |
| 5,381,112 A | * | 1/1995 | Rybicki et al. | 330/253 |
| 5,748,040 A | * | 5/1998 | Leung | 330/253 |
| 5,844,442 A | * | 12/1998 | Brehmer | 330/258 |
| 5,936,466 A | * | 8/1999 | Andoh et al. | 330/253 |
| 5,990,743 A | * | 11/1999 | Gabara | 330/258 |
| 6,292,031 B1 | * | 9/2001 | Thompson et al. | 327/66 |
| 6,317,016 B1 | * | 11/2001 | Kuo | 333/215 |
| 6,329,878 B1 | * | 12/2001 | Edwards et al. | 330/264 |
| 6,377,121 B1 | * | 4/2002 | Giduturi | 330/253 |
| 6,407,658 B2 | * | 6/2002 | Kuo | 337/552 |
| 6,429,700 B1 | * | 8/2002 | Yang | 327/108 |
| 6,469,579 B2 | * | 10/2002 | Bazes | 330/253 |

* cited by examiner

Primary Examiner—Timothy P. Callahan
Assistant Examiner—Hai L. Nguyen
(74) Attorney, Agent, or Firm—Bever, Hoffman & Harms, LLP; James E. Parsons

(57) ABSTRACT

A novel operational amplifier is disclosed which is divided into an input stage, a common mode feedback stage and an output stage. The output of the operational amplifier swings rail to rail, and the input may swing nearly rail to rail. The operational amplifier combines fast response with low power consumption and low supply voltage.

26 Claims, 1 Drawing Sheet

LOW VOLTAGE, LOW POWER OPERATIONAL AMPLIFIER WITH RAIL TO RAIL OUTPUT

TECHNICAL FIELD OF THE INVENTION

The present invention relates to operational amplifiers, and in particular to a low voltage, low power operational amplifier with rail to rail output.

BACKGROUND OF THE INVENTION

In integrated circuit technology, smaller design rules have been pursued as a means to reduce chip area, with a corresponding increase in the number of chips that can be produced per wafer and a corresponding decrease in per-chip cost. However, smaller design rules have also decreased the internal signal voltages that can be maintained by a chip. With smaller signal voltage ranges to work with, it becomes increasingly important that integrated circuit signal processing components, including operational amplifiers, are able to make full use of the available signal voltage range. Existing operational amplifiers have been largely unable to handle input voltage swings ranging from the high power supply voltage to the low power supply voltage (i.e. rail to rail), nor have they been able to produce output voltage swings from rail to rail.

SUMMARY OF THE INVENTION

Therefore, a need has arisen for an operational amplifier that addresses the disadvantages and deficiencies of the prior art. In particular, a need has arisen for a low power, high speed operational amplifier with the capacity for both input and output signals that swing from rail to rail, or as near to rail to rail as possible.

Accordingly, a novel operational amplifier is disclosed. In one embodiment, the operational amplifier includes an input stage which has a differential amplifier coupled to receive the first and second input voltages. The differential amplifier comprises a first current source providing a first source current to a first node and a second current source providing a second source current to a second node. The differential amplifier provides a first output voltage at the first node and a second output voltage at the second node. The operational amplifier further includes a common mode feedback stage coupled to the first and second nodes. The common mode feedback stage compares an average voltage of the first and second nodes to a reference voltage and changes the first and second source currents in response to a difference between the reference voltage and the average voltage of the first and second nodes. The operational amplifier further includes an output stage coupled to the first and second nodes and an output node. The output stage amplifies voltages at the first and second nodes to provide an output voltage at the output node.

An advantage of the present invention is that the operational amplifier combines fast response with low power consumption and low supply voltage. Another advantage of the present invention is that the output of the operational amplifier swings rail to rail, and the input may swing nearly rail to rail.

BRIEF DESCRIPTION OF THE DRAWINGS

For a more complete understanding of the present invention and for further features and advantages, reference is now made to the following description taken in conjunction with the accompanying FIGURE, which is a schematic diagram of an operational amplifier constructed in accordance with the present invention.

DETAILED DESCRIPTION OF THE INVENTION

Figure 1:
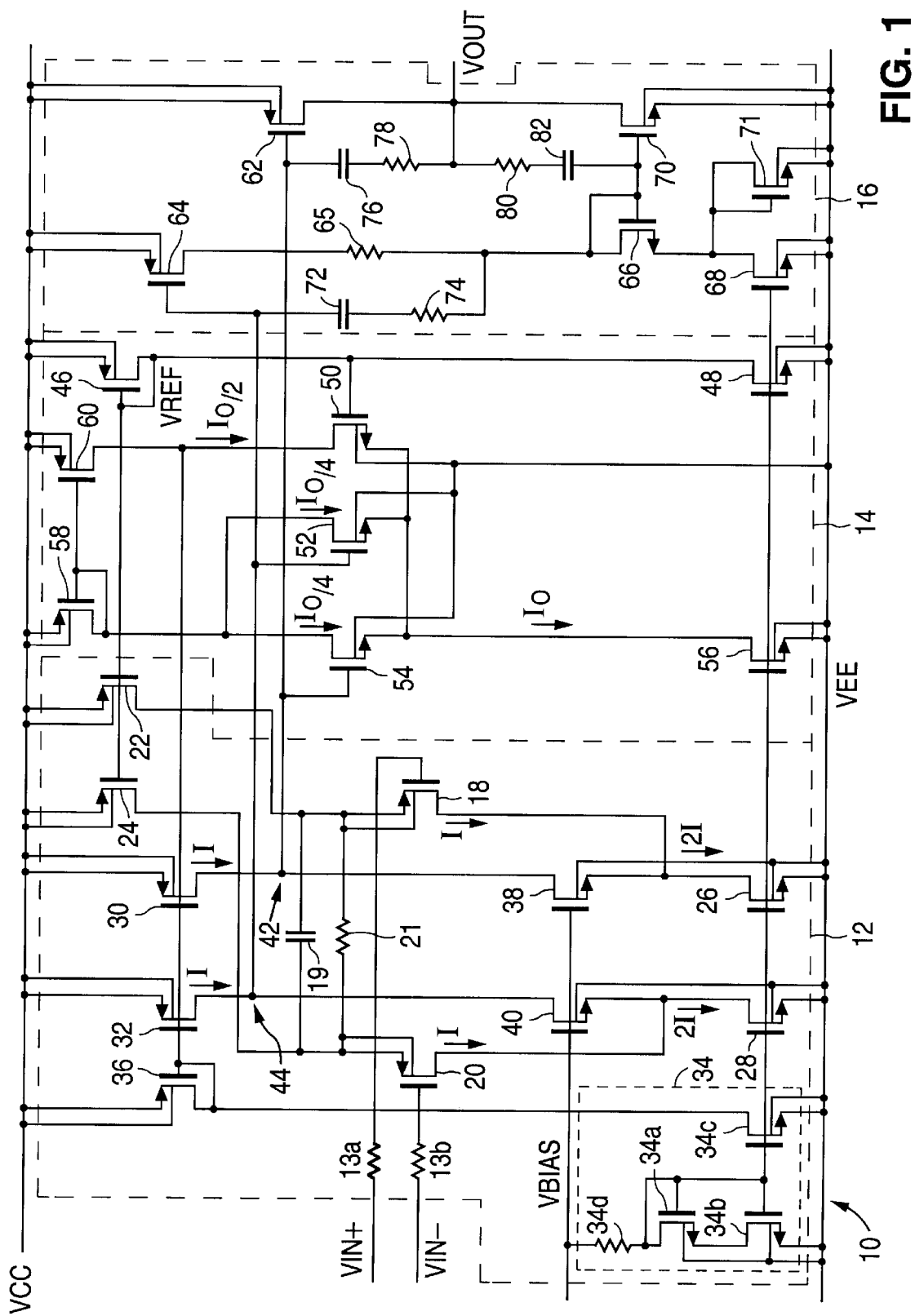

The preferred embodiments of the present invention and their advantages are best understood by referring to the FIGURE. Like numerals are used for like and corresponding parts of the various drawings.

Referring to the FIGURE, a schematic diagram of an operational amplifier 10 constructed in accordance with the present invention is shown. It will be understood that any transistor or capacitor shown in the FIGURE may in fact represent a plurality of transistors or capacitors connected in parallel. Likewise, any resistor shown in the FIGURE may in fact represent a plurality of resistors connected in series.

Operational amplifier 10 has three main stages, an input stage 12, a common mode feedback stage 14 and an output stage 16, which are shown by dashed lines in the figure. Operational amplifier 10 receives two input signals, VIN+ and VIN−, and generates a single output signal VOUT reflecting the difference between VIN+ and VIN−.

Input signals VIN+ and VIN− are provided, through input resistors 13a and 13b, respectively, to the gates of p-type transistors 18 and 20, respectively. Transistors 18 and 20 have their bodies tied to their sources. The source of transistor 18 is connected to a current source transistor 22, which supplies a DC current (I) to transistor 18. Likewise, the source of transistor 20 is connected to a current source transistor 24, which supplies a DC current (I).

Transistors 18 and 20 convert the differential voltage input VIN+ and VIN− into a differential current at their respective drains. The drain of transistor 18 is connected to the drain of a current source transistor 26, which conducts a DC current (2I) which is twice the DC current conducted by current source transistor 22. Similarly, the drain of transistor 20 is connected to the drain of a current source transistor 28, which conducts a DC current (2I) which is twice the DC current conducted by current source transistor 24.

Half of the DC current conducted by current source transistor 26 is therefore provided by current source transistor 22. The other half is provided by a current source transistor 30, which conducts a DC current (I) equal to the DC current conducted by current source transistor 22. Likewise, half of the DC current conducted by current source transistor 28 is provided by current source transistor 24, while the other half is provided by a current source transistor 32.

Transistors 18 and 20 form a differential pair, with the instantaneous current conducted by each transistor ranging from approximately zero to approximately 2I, or two times the current provided by each current source transistor 22, 24. A resistor 21 connected between the sources of transistors 18 and 20 provides a current path from current source transistor 22 to transistor 20 when VIN− is low, and from current source transistor 24 to transistor 18 when VIN+ is low. A capacitor 19 is connected between the sources of transistors 18 and 20 to provide frequency compensation.

Various DC currents in operational amplifier 10 originate with a bias voltage VBIAS provided by a conventional bias circuit (not shown). The bias voltage VBIAS is provided to a current mirror arrangement 34 consisting of two programming transistors 34a and 34b and a mirroring transistor 34c. A resistor 34d in series with programming transistors 34a and 34b sets the current conducted by programming transistors 34a and 34b, thereby setting the gate voltage of programming transistors 34a and 34b. This gate voltage is provided to a number of mirroring transistors, including mirroring transistor 34c and current source transistors 26, 28, 56, 48, and 68.

The current conducted by mirroring transistor 34c is drawn from a programming transistor 36. Programming transistor 36 provides the gate voltage which allows current source transistors 30 and 32 to provide a constant DC current as previously described.

The bias voltage VBIAS is also provided to the gates of transistors 38 and 40. These n-type transistors have their sources connected to the respective drains of transistors 26 and 28. The drains of transistors 38 and 40 are labeled as nodes 42 and 44, respectively, and are connected to the respective sources of current source transistors 30 and 32. Transistors 38 and 40 therefore each conduct a DC current (I).

The differential current conducted by transistors 18 and 20 is translated into a differential voltage at nodes 42 and 44. This arrangement is known as a "folded cascode" arrangement. With this input stage arrangement, an input voltage range (for VIN+ and VIN−) from VEE up to one threshold voltage below VCC may be accommodated without pinching off transistors in input stage 12. Nodes 42 and 44 provide the differential (voltage) output of input stage 12.

Because the voltages at nodes 42 and 44 are otherwise free to float in the same direction, common mode feedback stage 14 is provided to ensure that nodes 42 and 44 are kept at a specified DC (average) voltage. This specified voltage (VREF) is provided by a diode 46 in series with a current source transistor 48. Current source transistor 48 is a mirroring transistor for current mirror arrangement 34 described above. The series arrangement of diode 46 and current source transistor 48 sets VREF at one threshold voltage below VCC.

The voltage VREF is provided to the gate of an n-type transistor 50, which has a source connected to the sources of two other n-type transistors 52 and 54. The sources of transistors 50, 52 and 54 are all connected to a current source transistor 56, which is a mirroring transistor for current mirror arrangement 34 described above.

The gate of transistor 52 is connected to node 42, while the gate of transistor 54 is connected to node 44. The drains of transistors 52 and 54 are connected to the drain of a programming transistor 58.

Transistors 52 and 54 each have a channel width equal to one-half the channel width of transistor 50. Thus, if nodes 42 and 44 both have a voltage equal to VREF, then transistor 50 conducts one-half the current sourced by transistor 56, while transistors 52 and 54 each conduct one-quarter of the current sourced by transistor 56. When nodes 42 and 44 carry different voltages, but have an average (common mode) voltage equal to VREF, then transistors 52 and 54 combined still conduct one-half of the current sourced by transistor 56, while transistor 50 conducts the other half of the current.

The current conducted by programming transistor 58 is matched by a mirroring transistor 60. This mirrored current is provided to the drain of transistor 50, which is also connected to the gate of transistor 36. Thus, in the above-mentioned case where transistors 52 and 54 combined conduct the same current and transistor 50, the voltage at the gate of transistor 36 will be stable at one threshold voltage below VCC.

If the common mode voltage rises above VREF, then transistors 52 and 54 will conduct more than one-half the current sourced by transistor 56. This current is drawn from programming transistor 58 and mirrored by transistor 60. In this case, transistor 50 conducts less than one-half the current sourced by transistor 56. Since transistor 60 conducts more current than transistor 50, the voltage at the gate of transistor 36 rises. This voltage is also provided to the bases of current source transistors 30 and 32, causing a decrease in the currents conducted by these current sources. The voltages at nodes 42 and 44 therefore both fall, counteracting the rise in common mode voltage at these nodes.

A spontaneous decrease in common mode voltage at nodes 42 and 44 is likewise counteracted by common mode feedback stage 14. Common mode feedback stage 14 therefore provides a means for stabilizing the common mode voltage at nodes 42 and 44 at the reference voltage VREF.

The voltages at nodes 42 and 44, as generated by input stage 12 and stabilized in common mode by common mode feedback stage 14, are provided to output stage 16. From this differential voltage, output stage 16 generates a single output signal VOUT which can swing from rail to rail (VCC to VEE).

Node 42 is connected to the gate of a p-type transistor 62, which has a source connected to VCC and a drain connected to the output node. Node 44 is connected to the gate of a p-type transistor 64, which has a source connected to VCC and a drain coupled, through a resistor 65, to the gate and drain of a diode-configured n-type transistor 66.

In DC, nodes 42 and 44 carry a voltage equal to VREF, which is one threshold voltage below VCC. Transistors 62 and 64 are therefore in a virtual current mirror relationship with transistor 46, which sets VREF. The relative width-to-length ratios of transistors 46, 62 and 64 therefore determine the DC current drawn by output stage 16.

A current source transistor 68 is connected to the source of programming transistor 66 and draws a DC current from the source of transistor 66. This current is conducted by transistor 66, which sets the gate voltage for an output transistor 70. Transistor 70 is an n-type transistor with its drain connected to the output node and its source connected to VEE (ground). Together, transistors 62 and 70 set the output voltage VOUT.

In order to limit the output current when VOUT is low (i.e. VEE), the gate voltage of transistor 70 must be limited. As previously mentioned, the voltage at node 44 varies from approximately VCC to approximately two threshold voltages below VCC. Thus, at its lowest values, this voltage will turn on transistor 64 hard. Since the current through current source transistor 68 is limited, the voltage at the gate of transistor 70 could rise to nearly VCC. Depending on the load driven by operational amplifier 10, overdriving transistor 70 in this manner may result in excessive current and device failure.

To limit the voltage at the gate of transistor 70, a diode clamp 71 is connected in parallel with current source transistor 68. Diode clamp 71 limits the voltage at the source of transistor 66 to one threshold voltage above VEE, thereby limiting the gate-to-source voltage of transistor 70 to two threshold voltages. There is no need for such a clamp to limit the gate voltage of transistor 62 because, as previously noted, the voltage at node 42 remains within two threshold voltages of VCC.

A capacitor 72 and resistor 74 are connected in series between node 44 and the gate of transistor 70. Capacitor 72 and resistor 74 provide frequency compensation. Similarly, a capacitor 76 and a resistor 78 are connected in series between node 42 and the output node. Another resistor 80 and capacitor 82 are connected in series between the gate of transistor 70 and the output node. These are likewise provided for frequency compensation.

Operational amplifier 10 combines fast response with low power consumption and low supply voltage. Response speed is enhanced by the low number of transistors between input and output: after the folded cascode input arrangement, the resulting voltage is supplied directly to the output driving transistors. Diode clamp 71 ensures that output power is limited as previously described.

Operational amplifier may be fabricated using standard CMOS fabrication techniques. A list of exemplary device sizes and values are provided in Table A. These values represent only one example of the present invention, and are not limiting.

TABLE A

| | Transistors | |
|---|---|---|
| Reference Numeral | Channel Length (microns) | Total Channel Width* (microns) |
| 18 | 2 | 400 |
| 20 | 2 | 400 |
| 22 | 2 | 20 |
| 24 | 2 | 20 |
| 26 | 8 | 80 |
| 28 | 8 | 80 |
| 30 | 4 | 20 |
| 32 | 4 | 20 |
| 34a | 1 | 10 |
| 34b | 8 | 20 |
| 34c | 8 | 20 |
| 36 | 4 | 10 |
| 38 | 2 | 50 |
| 40 | 2 | 50 |
| 46 | 2 | 20 |
| 48 | 8 | 20 |
| 50 | 2 | 20 |
| 52 | 2 | 10 |
| 54 | 2 | 10 |
| 56 | 8 | 20 |
| 58 | 4 | 20 |
| 60 | 4 | 20 |
| 62 | 2 | 300 |
| 64 | 2 | 10 |
| 66 | 2 | 20 |
| 68 | 4 | 80 |
| 70 | 2 | 300 |
| 71 | 4 | 40 |

| Resistors | |
|---|---|
| Reference Numeral | Resistance (oms) |
| 13a | 432 |
| 13b | 432 |
| 21 | 30,000 |
| 34d | 100,000 |
| 65 | 100,000 |
| 74 | 175,000 |
| 78 | 70,000 |
| 80 | 35,000 |

| Capacitors | |
|---|---|
| Reference Numeral | Capacitance (pF) |
| 19 | 2 |
| 72 | 0.75 |
| 76 | 0.75 |
| 82 | 0.75 |

TABLE A-continued

| Transistors Voltages | |
|---|---|
| Name | Volts |
| VCC | 5 |
| VEE | 0 |
| VBIAS | — |

Although the invention and its advantages have been described in detail, it should be understood that various changes, substitutions, and alterations can be made therein without departing from the spirit and scope of the invention as defined by the appended claims.

I claim:

1. An operational amplifier comprising:
   an input stage comprising a differential amplifier coupled to receive first and second input voltages, the differential amplifier comprising a first current source providing a first source current to a first node and a second current source providing a second source current to a second node, the differential amplifier providing a first output voltage at the first node and a second output voltage at the second node;
   a common mode feedback stage comprising
      a third current source,
      a first transistor coupled to receive a reference voltage at a gate terminal, the first transistor having a source terminal coupled to the third current source, a second transistor having a gate terminal coupled to the first node, the second transistor having a source terminal coupled to the third current source,
      a third transistor having a gate terminal coupled to the second node, the third transistor having a source terminal coupled to the third current source, and
      a current mirror coupled to drain terminals of the first, second and third transistors, the current mirror being operable to provide to the drain terminal of the first transistor a current approximately equal to the currents conducted by the second and third transistors,
   the first and second current sources being coupled to the drain terminal of the first transistor, the first and second current sources being operable to change the first and second source currents in response to a voltage at the drain terminal of the first transistor; and
   an output stage coupled to the first and second nodes and an output node, the output stage being operable to amplify voltages at the first and second nodes to provide an output voltage at the output node.

2. An operational amplifier comprising:
   an input stage comprising a differential amplifier coupled to receive first and second input voltages, the differential amplifier comprising a first current source providing a first source current to a first node and a second current source providing a second source current to a second node, the differential amplifier providing a first output voltage at the first node and a second output voltage at the second node;
   a common mode feedback stage coupled to the first and second nodes, the common mode feedback stage being operable to compare an average voltage of the first and second nodes to a reference voltage, the common mode feedback stage being operably coupled to the input stage to change the first and second source currents in response to a difference between the reference voltage and the average voltage of the first and second nodes; and an output stage comprising a first output transistor comprising a gate terminal coupled to the first node, a source terminal coupled to a first supply voltage and a drain terminal coupled to an output node, an inverting amplifier coupled to the second node, the inverting amplifier being operable to generate an output voltage varying inversely with a voltage at the second node, and a second output transistor comprising a gate terminal coupled to receive the output voltage from the inverting amplifier, the second output transistor further comprising a source terminal coupled to a second supply voltage and a drain terminal coupled to the output node.

3. The operational amplifier of claim 2, wherein the inverting amplifier of the output stage comprises:

a third output transistor comprising a gate terminal coupled to the second node and a source terminal coupled to the first supply voltage;

a current source coupled to the second supply voltage; and a fourth output transistor comprising gate and drain terminals coupled to a drain terminal of the third output transistor, the fourth output transistor further comprising a source terminal coupled to the current source, the gate terminal of the fourth output transistor being coupled to the gate terminal of the second output transistor.

4. The operational amplifier of claim 3 wherein the inverting amplifier of the output stage further comprises a diode coupled between the source terminal of the fourth output transistor and the second supply voltage, the diode being operable to limit the voltage at the source terminal of the fourth output transistor.

5. The operational amplifier of claim 2, wherein the input stage further comprises:

a differential pair of transistors coupled to receive the first and second input voltages, the differential pair being operable to generate first and second currents in response to the first and second input voltages;

a third current source coupled to the first node, the third current source drawing a third source current, the third current source being coupled to receive the first current and to draw a resulting first difference current from the first node; and a fourth current source coupled to a second node, the fourth current source drawing a fourth source current, the fourth current source being coupled to receive the second current and to draw a resulting second difference current from the second node.

6. The operational amplifier of claim 2, wherein the output stage further comprises:

a first frequency compensation network coupled between the first node and the output node; and a second frequency compensation network coupled between the second node and the output node.

7. The operational amplifier of claim 6, wherein the first and second frequency compensation networks each comprise a resistor and a capacitor connected in series.

8. The operational amplifier of claim 5, wherein the input stage further comprises a capacitor coupled between source terminals of the differential pair of transistors.

9. An operational amplifier comprising:

an input stage comprising a differential pair of transistors coupled to receive the first and second input voltages, the differential pair being operable to generate first and second currents in response to the first and second input voltages, the input stage further comprising a first current source coupled to a first node, the first current source drawing a first source current, the first current source being coupled to receive the first current and to draw a resulting first difference current from the first node, the input stage further comprising a second current source coupled to a second node, the second current source drawing a second source current, the second current source being coupled to receive the second current and to draw a resulting second difference current from the second node, the input stage further comprising a third current source coupled to provide a third source current to the first node, the input stage further comprising a fourth current source coupled to provide a fourth source current to the second node;

a common mode stage comprising a fifth current source, a first transistor coupled to receive the reference voltage at a gate terminal, the first transistor having a source terminal coupled to the fifth current source, a second transistor having a gate terminal coupled to the first node, the second transistor having a source terminal coupled to the fifth current source, a third transistor having a gate terminal coupled to the second node, the third transistor having a source terminal coupled to the fifth current source, and a current mirror coupled to drain terminals of the first, second and third transistors, the current mirror being operable to provide to the drain terminal of the first transistor a current approximately equal to the currents conducted by the second and third transistors, the third and fourth current sources being coupled to the drain terminal of the first transistor, the third and fourth current sources being operable to change the third and fourth source currents in response to a voltage at the drain terminal of the first transistor; and an output stage coupled to the first and second nodes and an output node, the output stage being operable to amplify voltages at the first and second nodes to provide an output voltage at the output node.

10. The operational amplifier of claim 9, wherein the output stage comprises:

a first output transistor comprising a gate terminal coupled to the first node, a source terminal coupled to a first supply voltage and a drain terminal coupled to an output node;

an inverting amplifier coupled to the second node, the inverting amplifier being operable to generate an output voltage varying inversely with a voltage at the second node; and a second output transistor comprising a gate terminal coupled to receive the output voltage from the inverting amplifier, a source terminal coupled to a second supply voltage and a drain terminal coupled to the output node.

11. The operational amplifier of claim 10, wherein the output stage further comprises:

a first frequency compensation network coupled between the first node and the output node; and a second frequency compensation network coupled between the second node and the output node.

12. The operational amplifier of claim 11, wherein the first and second frequency compensation networks each comprise a resistor and a capacitor connected in series.

13. The operational amplifier of claim 10, wherein the inverting amplifier of the output stage comprises:

a third output transistor comprising a gate terminal coupled to the second node and a source terminal coupled to the first supply voltage;

a current source coupled to the second supply voltage; and a fourth output transistor comprising gate and drain terminals coupled to a drain terminal of the third output transistor, the fourth output transistor further comprising a source terminal coupled to the current source, the gate terminal of the fourth output transistor being coupled to the gate terminal of the second output transistor.

14. The operational amplifier of claim 13, wherein the inverting amplifier of the output stage further comprises a diode coupled between the source terminal of the fourth output transistor and the second supply voltage, the diode being operable to limit the voltage at the source terminal of the fourth output transistor.

15. The operational amplifier of claim 9, wherein the input stage further comprises a capacitor coupled between source terminals of the differential pair of transistors.

16. An operational amplifier comprising:

an input stage comprising a differential amplifier that comprises a first current source providing a first source current at a first node and a second current source providing a second source current at a second node;

a common mode feedback stage coupled to the first and second nodes, the common mode feedback stage being operable to perform a comparison of an average voltage of the first and second nodes to a reference voltage, the common mode feedback stage comprising a third current source coupled to the first and second current sources, the third current source being operable to control the first source current and the second source current in response to the comparison; and an output stage coupled to the first and second nodes, the output stage comprising an output node, the output stage being operable to amplify voltages at the first and second nodes to provide an output voltage at the output node;

wherein the third current source comprises:

a first transistor coupled to receive the reference voltage at a gate terminal, the first transistor having a source terminal coupled to the third current source;

a second transistor having a gate terminal coupled to the first node, the second transistor having a source terminal coupled to the third current source; and a third transistor having a gate terminal coupled to the second node, the third transistor having a source terminal coupled to the third current source, wherein the current at the drain terminal of the first transistor is approximately equal to the currents conducted by the second and third transistors and the first and second current sources being coupled to the drain terminal of the first transistor so that the first and second current sources change the first and second source currents in response to a voltage at the drain terminal of the first transistor.

17. The operational amplifier of claim 16, wherein the output stage comprises a fourth current source operable to limit a current flowing through the output stage without regard to a voltage at the first and second nodes.

18. The operational amplifier of claim 16, wherein the input stage further comprises a fourth current source coupled to the first node and a fifth current source coupled to the second node, the fourth current source providing a third source current at the first node and the fifth current source providing a fourth source current at the second node.

19. The operational amplifier of claim 16, further comprising a current mirror coupled to the drain terminals of the first, second and third transistors, the current mirror being operable to provide a current at the drain terminal of the first transistor so that it is approximately equal to a sum of a current conducted by the second transistor and a current conducted by the third transistor.

20. The operational amplifier of claim 19, wherein the current mirror comprises a fourth transistor having a gate coupled to the drain of the first transistor and a fifth transistor having a gate coupled to the gate of the fifth transistor.

21. An operational amplifier comprising:

an input stage comprising first and second nodes;

a common mode feedback stage coupled to the first and second nodes, the common mode feedback stage being operable to perform a comparison of an average voltage of the first and second nodes to a reference voltage, the common mode feedback stage being operably coupled to the input stage to change a first current at the first node and a second current at the second node in response to the comparison; and an output stage coupled to the first and second nodes, the output stage comprising an output node and a first current source, the output stage being operable to amplify voltages at the first and second nodes to provide an output voltage at the output node, the first current source operable to limit a current flowing through the output stage without regard to a voltage at the first and second nodes;

wherein the first current source comprises:

a first output transistor comprising a gate terminal coupled to the first node, a source terminal coupled to a first supply voltage and a drain terminal coupled to the output node;

an inverting amplifier coupled to the second node, the inverting amplifier being operable to generate an output voltage varying inversely with a voltage at the second node; and a second output transistor comprising a gate terminal coupled to receive the output voltage from the inverting amplifier, a source terminal coupled to a supply voltage and a drain terminal coupled to the output node.

22. The operational amplifier of claim 21, wherein the common mode feedback stage comprises a fourth current source operable to change the first current and the second current in response to the common mode feedback stage comparing the average voltage of the first and second nodes to the reference voltage.

23. The operational amplifier of claim 21, wherein the inverting amplifier of the output stage comprises:

a third output transistor comprising a gate terminal coupled to the second node and a source terminal coupled to the first supply voltage;

the second current source; and a fourth output transistor comprising gate and drain terminals coupled to a drain terminal of the third output transistor, the fourth output transistor further comprising a source terminal coupled to the current source, the gate terminal of the fourth output transistor being coupled to the gate terminal of the second output transistor.

24. The operational amplifier of claim 23, wherein the inverting amplifier further comprises a diode coupled between the source terminal of the fourth output transistor and the supply voltage, the diode being operable to limit the voltage at the source terminal of the fourth output transistor.

25. The operational amplifier of claim 21, wherein the output stage further comprises:

a first frequency compensation network coupled between the first node and the output node; and a second frequency compensation network coupled between the second node and the output node.

26. The operational amplifier of claim 25, wherein the first and second frequency compensation networks each comprise a resistor and a capacitor connected in series.

* * * * *